United States Patent
Shibamoto

(10) Patent No.: US 8,956,515 B2
(45) Date of Patent: Feb. 17, 2015

(54) MULTILAYER-FILM SPUTTERING APPARATUS AND METHOD OF FORMING MULTILAYER FILM

(75) Inventor: Masahiro Shibamoto, Yokohama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 1038 days.

(21) Appl. No.: 13/028,877

(22) Filed: Feb. 16, 2011

(65) Prior Publication Data

US 2011/0168545 A1 Jul. 14, 2011

Related U.S. Application Data

(63) Continuation of application No. PCT/JP2009/067719, filed on Oct. 13, 2009.

(30) Foreign Application Priority Data

Oct. 30, 2008 (JP) .................................. 2008-279213

(51) Int. Cl.
*H01J 37/34* (2006.01)
*G11B 5/851* (2006.01)
*C23C 14/34* (2006.01)

(52) U.S. Cl.
CPC ............ *G11B 5/851* (2013.01); *C23C 14/3464* (2013.01); *H01J 37/3405* (2013.01); *H01J 37/3429* (2013.01); *H01J 37/347* (2013.01)
USPC ............ 204/298.03; 204/298.23; 204/298.26; 204/192.12

(58) Field of Classification Search
CPC .. C23C 14/3464; C23C 14/54; C23C 14/542; G11B 5/851; H01J 37/347; H01J 37/3429; H01J 37/3405; H01J 37/3476
USPC ............ 204/298.03, 298.18, 298.23, 298.26, 204/192.12
See application file for complete search history.

(56) References Cited

U.S. PATENT DOCUMENTS 6,328,856 B1 12/2001 Brucker .................... 204/192.12
7,090,754 B2 8/2006 Takahashi ................ 204/298.28
(Continued)

FOREIGN PATENT DOCUMENTS

JP 11-302841 A 11/1999
JP 2002-280318 A 9/2002
(Continued)

OTHER PUBLICATIONS

International Search Report and International Preliminary Report on Patentability issued in International Application No. PCT/JP2009/067719—15 pages.

*Primary Examiner* — Rodney McDonald
(74) *Attorney, Agent, or Firm* — Fitzpatrick, Cella, Harper & Scinto

(57) ABSTRACT

Provided is a sputtering apparatus which can form a multi-layer film giving high productivity and with less spiral pattern by effective use of targets, and a method of forming multilayer film using the apparatus. An embodiment is a multilayer-film sputtering apparatus comprising: a rotatable cathode unit (30) having cathodes (7a and 7b) arranged on the same circumference with respect to the rotational center, and having a power-supply mechanism for supplying power to each cathode; a sensor (14) for detecting the position of cathode; and a rotation mechanism for rotating the cathode unit (30).

7 Claims, 13 Drawing Sheets

(56) References Cited

U.S. PATENT DOCUMENTS 7,156,961 B2    1/2007   Okatani et al. ............. 204/192.2
2003/0019739 A1*  1/2003   Shibamoto et al. ........ 204/192.2

FOREIGN PATENT DOCUMENTS

JP    2003-141719 A    5/2003
JP    2004-156122 A    6/2004

* cited by examiner

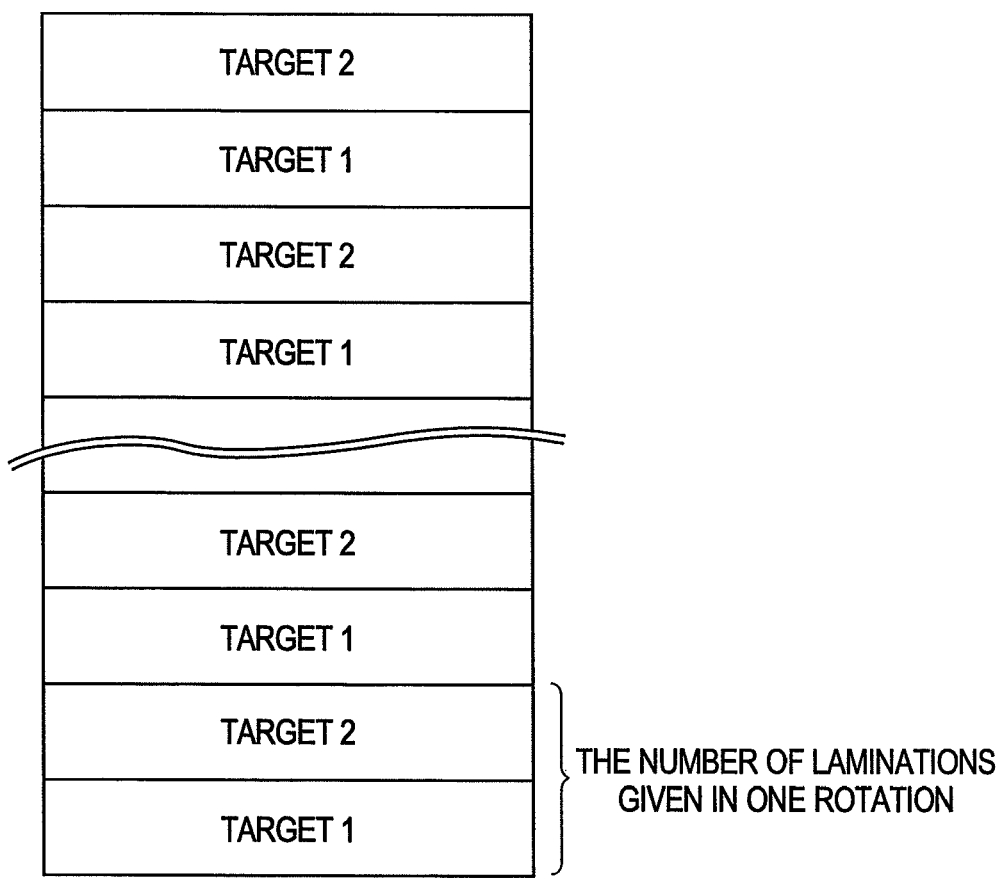

MULTILAYER-FILM SPUTTERING APPARATUS AND METHOD OF FORMING MULTILAYER FILM

CROSS-REFERENCE TO RELATED APPLICATIONS

This application is a continuation application of International Application No. PCT/JP2009/067719, filed on Oct. 13, 2009, the entire contents of which are incorporated by reference herein.

This application also claims the benefit of priority from Japanese Patent Application No. 2008-279213 filed on Oct. 30, 2008, the entire contents of which are incorporated herein by reference.

TECHNICAL FIELD

The present invention relates to a multilayer-film sputtering apparatus for successively forming a multilayer film, and to a method of forming a multilayer film by using the apparatus.

BACKGROUND ART

Perpendicular recording medium in current hard disk applies a recording layer having a composition containing oxide such as CoCrPt—$SiO_2$ or CoCrPt—$TiO_2$. In the future, the perpendicular recording medium is expected to have a multilayer-film structure such as Fe/Pt or Co/Pt which is a High-Ku material.

Under a condition of ensuring the maintenance cycle of one week or longer, however, there is required to have cathode units by the number of the layers in order to fabricate the multilayer-film structure.

A structural example of the sputtering apparatus for forming such a multilayer film is disclosed in Patent Document 1, which is illustrated in FIGS. 5A to 5C and FIG. 6. Outline of the structure is described below.

FIG. 5A is a schematic drawing of a cross-sectional structure perpendicular to the substrate-carrying direction, of a sputtering chamber 101. As illustrated in FIG. 5A, a rotary cathode unit 103 is rotatably mounted to each of the two side-walls of the sputtering chamber 101. Discharge is generated on both sides of a carrier unit 102 which holds two sheets of substrates 122, and thus laminated films are simultaneously formed on both sides of the two sheets of substrates 122.

As illustrated in FIG. 5B, each of the substrates 122 is held by the carrier 102 by three (for example) supporting claws 121, and the carrier 102 is then transferred to the respective treatment chambers by a known transfer mechanism.

FIG. 5C is plan view of the rotary cathode unit 103 viewed from the substrate 122 side. As illustrated in FIG. 5C, the rotary cathode unit 103 is provided with a CoB target 132, a Pd target 133, and a lamp heater (heat-treatment mechanism) 134 to heat the substrate 122, which are arranged on the same circumference with respect to the rotational center. A partition 131 is positioned between the target 132, the target 133, and the lamp heater 134, respectively, to prevent interference therebetween and to prevent contamination thereeach.

FIG. 6 is the A-A' section of FIG. 5C to describe detail structure and detail mechanism of the rotary cathode unit 103.

In the conventional sputtering apparatus illustrated in FIG. 6, at least one surface-treatment mechanism (the lamp heater 134 in FIG. 6) for the target 132, the target 133, and the substrate 122 is installed around a rotary shaft 130 of the rotary cathode unit 103. A substrate holder (the carrier 102) which holds one or more of substrate 122 is positioned so as to face the target 132, the target 133, and the lamp heater 134, and thus the rotary shaft 130 or the substrate holder is configured to be rotated. At a step part of a cylindrical outer frame 140 at rear-face side of the targets 132 and 133, there is positioned a magnet unit having a center magnet 141, a peripheral magnet 142, and a yoke 143. A center shaft 145 of the magnet unit is rotatably supported by a bearing 146. In addition, a gear 144 is mounted on the bottom surface of the yoke 143, and the gear 144 engages with a gear 119 located at front end of a cylinder member 116 positioned between the cylindrical outer frame 140 and the rotary shaft 130. As a result, rotation of a motor 117 induces the rotation of the cylindrical outer frame 140 via the gears 118 and 147, (or induces revolution of the targets 132 and 133 and the magnet unit centering on the rotary shaft 130), further induces rotation of the magnet unit via the gears 119 and 144. The cylinder member 116 is fixed to the rotary shaft 130 and the cylindrical outer frame 140 via a bearing 148.

According to the sputtering apparatus of FIG. 6, the sputtering is carried out while rotating the magnet unit. By, however, shifting the center of the center magnet 141 from the center of the center shaft 145, the sputtering apparatus is configured so as to prevent the formation of non-erosion region at the center of the target 132 and the target 133.

Another structural example of multilayer-film forming apparatus in related art is disclosed in Patent Document 2 as illustrated in FIG. 10 and FIG. 11. Outline of the apparatus will be given below.

In the multilayer-film forming apparatus illustrated in FIG. 10, a first cathode 1001 and a second cathode 1002 providing the first target 1001a and the second target 1002b, respectively, around the center shaft are arranged. FIGS. 11A to 11D illustrate the arrangement and the shape of pluralities of targets in the multilayer-film forming apparatus of FIG. 10. A substrate 1003 is supported by a supporting member 1004 by facing the first cathode 1001 and the second cathode 1002. In the multilayer-film forming apparatus of FIG. 10 and FIGS. 11A to 11D, when forming a multilayer film on the substrate 1003, films of the target materials of the first target 1001a and the second target 1002a are formed in a spiral manner on the substrate 1003 while rotating the first cathode 1001 and the second cathode 1002 around the center shaft.

LITERATURE OF RELATED ART

Patent Documents

[Patent Document 1] Japanese Patent Laid-Open No. 2003-141719
[Patent Document 2] U.S. Pat. No. 6,328,856

SUMMARY OF INVENTION

The conventional sputtering apparatus shown in FIGS. 5 and 6, however, have a problem of short maintenance cycle because the applicable target is small and the target life is short.

In addition, conventional sputtering apparatus has a problem of limited maximum available area of target because the target and the magnet unit are configured to revolve around the rotary shaft while the magnet unit rotates. Specifically, because the magnet unit rotates, the range available as the target corresponds to a circular region of the magnet unit rotation.

Furthermore in the conventional sputtering apparatus, for example when forming a film of Pd/(Co/Pd)×9/Pd, a power of 350 W DC is applied to the Pd target to deposit a 10 nm thick Pd film on the substrate. Then a power of 400 W DC is applied to the Co/Pd target to successively deposit, by nine cycles, a laminated film of Co (0.3 nm thick) and Pd (1.0 nm thick), which forms an artificial lattice film. After that, power supply to the Co/Pd target is stopped to deposit only the Pd film by 1.0 nm of thickness. Therefore, there is a problem of taking a long treatment time because at least three steps are required and because discharge has to be stopped between the steps.

The multilayer-film forming apparatus of FIG. 10 and FIGS. 11A to 11D is effective in forming a multilayer film.

Since, however, the film-forming on the substrate 1003 is conducted by rotating the first cathode 1001 and the second cathode 1002 while giving the start and stop of film-formation on the respective cathodes at the same time, the multilayer film formed on the substrate 1003 becomes a film in a spiral pattern. The phenomenon is described referring to FIG. 11A. For example, when the cathode shown in FIG. 11A rotates clockwise to form a Co film as the first layer, the area of the Co target (the first target 1001a) facing the substrate differs between the time of beginning and ending the film-forming. As a result, the thickness of Co film becomes thin at the beginning of film-forming, and the thickness thereof becomes thick at the end of film-forming compared with the thickness at the beginning of film-forming.

On thus formed Co film, when a Pt film is formed as the second layer film, similarly the area of the Pt target facing the substrate differs between the time of beginning and ending the film-forming. As a result, the thickness of Pt film becomes thin at the beginning of film-forming, and the thickness thereof at the end of film-forming becomes thick compared with the thickness at the beginning of film-forming.

FIG. 12A is a schematic drawing of the process of forming a multilayer film using the multilayer-film forming apparatus given in FIG. 10 and FIGS. 11A to 11D, resulting in forming a spiral pattern multilayer film. That is, the Co film is formed during a period of rotating the cathode clockwise by 0 to 0.5 rotation (from 0 degree to 180 degree), the Pt film is formed during a period of rotating the cathode clockwise by 0.5 to 1 rotation (from 180 degree to 360 degree), and the Co film is formed during a period of rotating the cathode clockwise by 1 to 1.5 rotation (from 360 degree to 540 degree). As a result, when the multilayer film formed in a region encircled by a rectangle of broken line in FIG. 12B, (a region 1201), is observed, a portion of the multilayer film is a spiral pattern film as illustrated in FIG. 12A.

A presumable reason of forming such a spiral pattern film is that, other than the one given above, when the Co target region (the first target 1001a) and the Pt target region (the second target 1002a) are rotated as illustrated in FIG. 11A, it can be considered that the multilayer film is not formed on the substrate by detecting the accurate position of each target region. Furthermore, discharge is presumably stopped between the steps of forming Co film and Pt film.

Anyhow, the multilayer-film forming apparatus of FIG. 10 and FIGS. 11A to 11D forms only a spiral pattern multilayer film on the substrate.

An object of the present invention is to provide a sputtering apparatus which solves the above problems, which effectively uses targets, which has excellent productivity, and which forms multilayer film with less spiral pattern, and to provide a method of forming multilayer film using the apparatus.

To achieve the above object, the present invention provides a multilayer-film sputtering apparatus which has: a rotatable cathode unit having n cathodes (n being integer of 2 or larger) arranged on the same circumference with respect to the rotation center, and having a power-supply mechanism for supplying power to each cathode; a sensor for detecting the position of the cathode; and a rotation mechanism for rotating the cathode unit.

The present invention provides a method of forming multilayer film comprising the steps of: providing a sputtering apparatus comprising a rotatable cathode unit having n cathodes (n being integer of 2 or larger) arranged on the same circumference with respect to the rotation center and having a power-supply mechanism for supplying power to each cathode, a sensor for detecting the position of the cathode, and a rotation mechanism for rotating the cathode unit; the method comprising the steps of: distinguishing n cathodes (n being integer of 2 or larger) based on the information detected by the sensor; forming a first film on a substrate by supplying power to a first cathode among the n cathodes (n being integer of 2 or larger) based on the information of structure indicating the structure of the multilayer film being formed and on the information of cathode distinguished in the distinguishing step to cause the first cathode to discharge; detecting at least one of the rotational angle and the number of rotations of the cathode unit by the sensor; forming a second film on the substrate by supplying power to a second cathode among the n cathodes (n being integer of 2 or larger) based on the information of structure, on the information of cathode distinguished by the sensor in the distinguishing step, and on at least one of the rotational angle and the number of rotations of the cathode unit detected in the detecting step to cause the second cathode to discharge; stopping power supply to the first cathode based on the information of structure, on the information of cathode distinguished by the sensor in the distinguishing step, and on at least one of the rotational angle and the number of rotations of the cathode unit detected in the detecting step; and stopping power supply to the second cathode based on the information of structure, on the information of cathode distinguished by the sensor in the distinguishing step, and on at least one of the rotational angle and the number of rotations of the cathode unit detected in the detecting step.

The present invention provides a computer-readable recording medium having a recorded program to allow a computer to execute a control method for a sputtering apparatus, the sputtering apparatus comprising: a rotatable cathode unit having n cathodes (n being integer of 2 or larger) arranged on the same circumference with respect to the rotation center, and having a power-supply mechanism for supplying power to each cathode; a sensor for detecting the position of the cathode; and a rotation mechanism for rotating the cathode unit, the control method comprising the steps of: distinguishing the n cathodes (n being integer of 2 or larger) based on the information detected by the sensor; initiating discharge of a first cathode among the n cathodes (n being integer of 2 or larger) based on the information of structure indicating the structure of the multilayer film being formed and on the information of cathode distinguished in the distinguishing step; measuring at least one of the rotational angle and the number of rotations of the cathode unit based on the information detected by the sensor; initiating discharge of a second cathode among the n cathodes (n being integer of 2 or larger) based on the information of structure, on the information of cathode distinguished in the distinguishing step, and on at least one of the rotational angle and the number of rotations of the cathode unit measured in the measuring step; stopping discharge of the first cathode based on the information of structure, on the information of cathode distinguished in the distinguishing step, and on at least one of the rotational angle and the number of rotations of the cathode unit measured in the measuring step; and stopping discharge of the second cathode based on the information of structure, on the information of cathode distinguished in the distinguishing step, and on at least one of the rotational angle and the number of rotations of the cathode unit measured in the measuring step.

The present invention allows improving the use efficiency of target and forming a multilayer film having no spiral pattern in a short time, which thus provides multilayer film with high productivity.

BRIEF DESCRIPTION OF THE DRAWINGS

FIG. 4 is a schematic cross-sectional view as an example of the multilayer film formed in the present invention.

DESCRIPTION OF EMBODIMENTS

Figure 1:
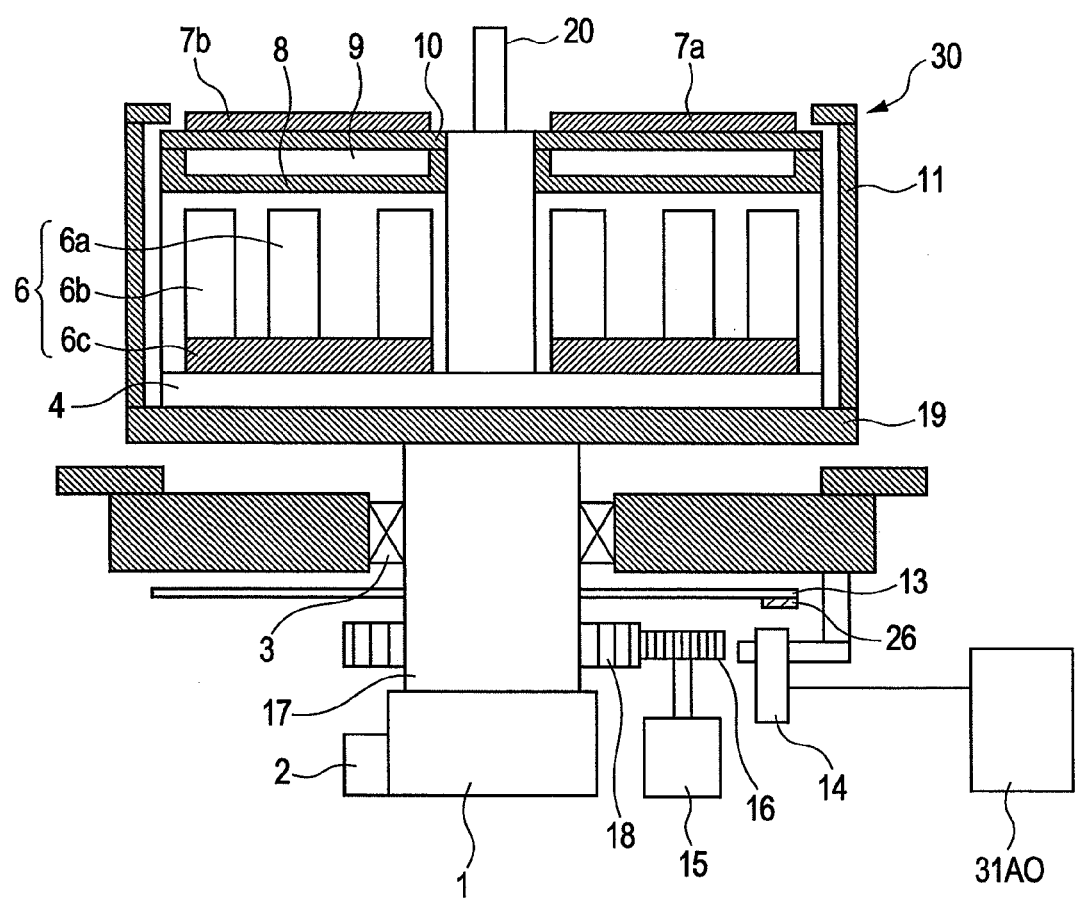
FIG. 1 is a cross-sectional view illustrating the structure of cathode unit in an embodiment of the sputtering apparatus of the present invention.
Figure 5A:
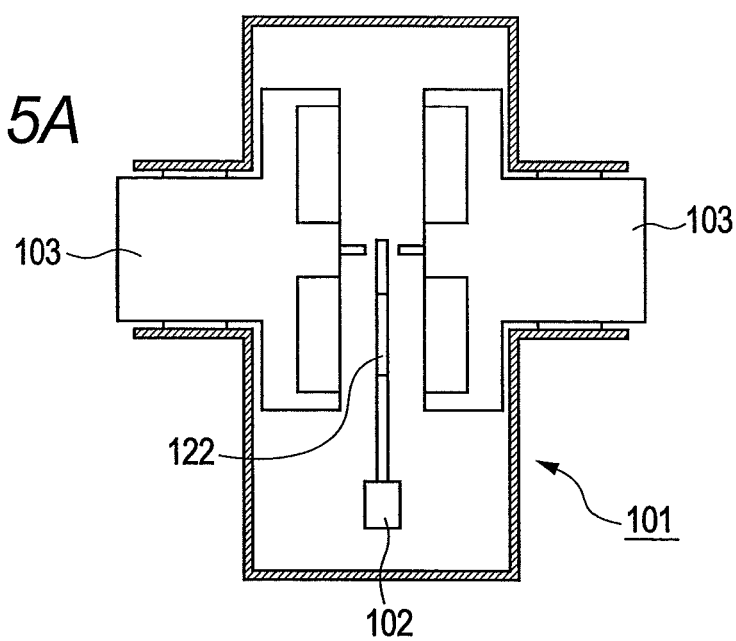
FIG. 5A is a schematic drawing illustrating the structure of conventional sputtering apparatus.

FIG. 1 is a structural example of cathode unit in a preferred embodiment of the multilayer-film sputtering apparatus of the present invention, and gives a schematic cross section including the rotary shaft. Since the cathode unit corresponds to the rotary cathode unit 103 given in FIG. 5A, and since the parts other than the rotary cathode unit are the same as those in FIG. 5A, description about those parts is not given here. In the same way as the conventional sputtering apparatus, the cathode unit is positioned in the sputtering chamber, and the sputtering apparatus of the present invention has the cathode unit, the sputtering chamber, and the substrate holder to hold the substrate on which the multilayer film is formed.

In FIG. 1, a cathode unit 30 is provided with an insulator 4, a magnet unit 6, a coolant passage-forming plate 8, a coolant passage 9, a backing plate 10 to place the target thereon, a shield 11, and a bottom plate 19.

Figure 2:
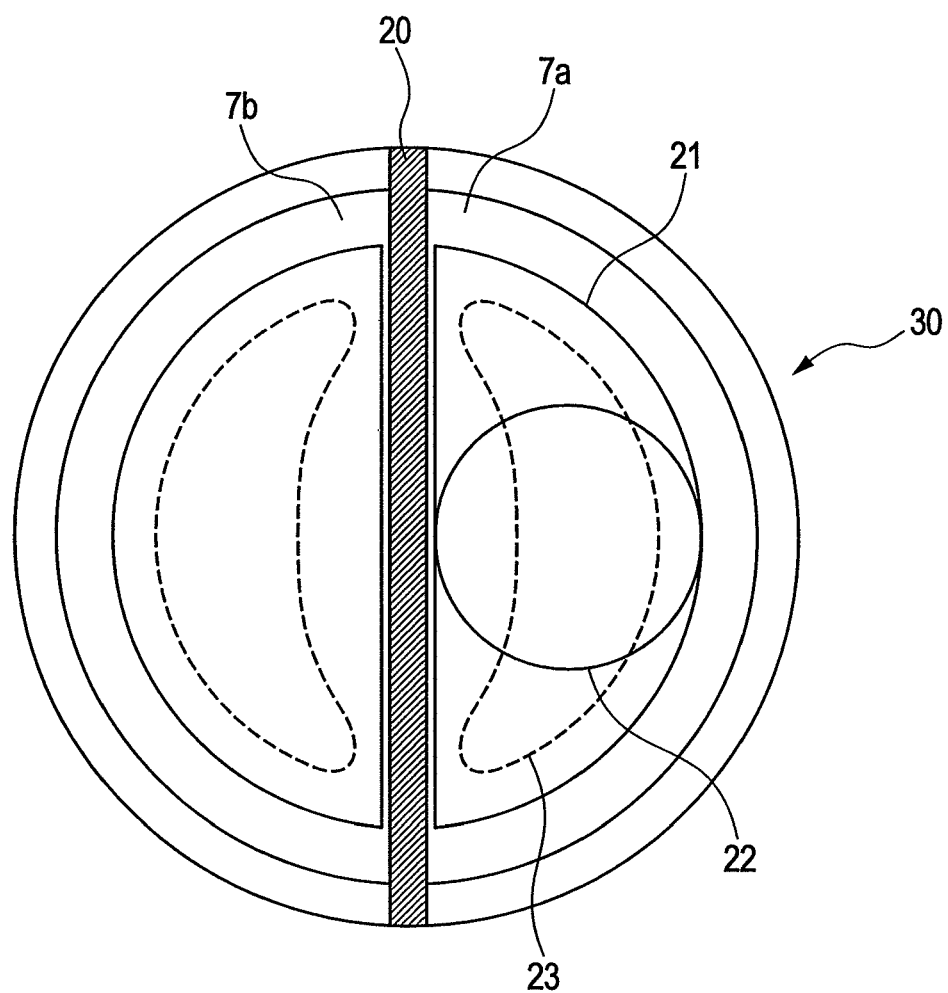
FIG. 2 is a schematic plan view of the cathode unit of FIG. 1 viewed from the substrate side.

FIG. 2 is a schematic plan view of the cathode unit of FIG. 1 viewed from the substrate side (viewed from upper portion of the page). In FIG. 2, cathodes 7a and 7b are arranged via a gap having a specified width as illustrated in FIG. 1, and a partition 20 is positioned between the cathodes 7a and 7b. The installation of the partition 20 allows suppressing incoming of sputter particles generated from a target mounted on a cathode (for example, the cathode 7a) onto the substrate surface facing a target mounted on the other cathode (for example, the cathode 7b). Therefore, even in a case where the discharge of the cathode 7a and the cathode 7b is initiated and when the sputter particles are generated from the targets mounted on the respective cathodes, the incoming of sputter particles from one target (sputter particles to be deposited) is allowed, while the incoming of sputter particles from the other target (sputter particles not to be deposited) is not allowed within a specified region on the substrate.

Although the structure illustrated in FIGS. 1 and 2 has the partition 20, the partition 20 can be eliminated. Furthermore, the gap between the cathodes 7a and 7b can be eliminated.

According to the present invention, the cathode unit 30 is provided with n cathodes (n being integer of 2 or larger). This example shows an embodiment having two cathodes 7a and 7b. As illustrated in FIG. 2, the cathodes 7a and 7b are arranged on the same circumference with respect to the rotation center of the cathode unit 30. At the time of conducting sputtering, targets having different material from each other are mounted on the respective cathodes 7a and 7b. For example, the target mounted on the cathode 7a is a Co target, and the target mounted on the cathode 7b is a Pt target. At rear side of the targets 7a and 7b, (opposite to the substrate), the coolant passage-forming plate 8 is located for cooling the cathodes 7a and 7b via the backing plate 10. To the coolant passage-forming plate 8, a coolant inlet pipe and a coolant outlet pipe, (both are not shown), are connected, and thus a coolant (for example, water) is supplied to the coolant passage 9 from a coolant supply part (not shown).

At rear side of the coolant passage-forming plate 8, there is located the magnet unit 6 on the insulator 4. The magnet unit 6 has a center magnet 6a, a peripheral magnet 6b, and a yoke 6c. The center magnet 6a and the peripheral magnet 6b have different polarity from each other, thus creating a closed magnetic field on each surface of the cathodes 7a and 7b. In FIG. 2, the region enclosed by a solid line 21 is the effective region allowing the maximum use as the target. The line indicated by a broken line 23 gives the zero magnetic field intensity in the perpendicular direction. Erosion of the target proceeds in the vicinity of the broken line. In the present invention, the magnets 6a and 6b are preferably arranged so as not to create non-erosion region within the region encircled by the broken line 23 for each target.

In FIG. 2, the region encircled by the solid line 22 indicates the effective region of the target in the conventional sputtering apparatus. According to the conventional apparatus, since the magnetic unit rotates within the rotary cathode unit during sputtering, the effective part of the magnet unit becomes circular, and thus the effective region of the target also becomes circular in response to this.

In contrast, according to the present invention, the magnet unit 6 does not rotate in the cathode unit 30, though the sputtering is conducted while rotating the cathode unit 30. Consequently, the effective region of the target does not need to become circular within the cathode unit, and the arrangement of the magnets and the cathode has only to be carried out so as to maximize the effective region. As a result, the effective region of the target can become broader than that of the conventional apparatus, which thus broadens the erosion region.

Since the example adopts two cathodes 7a and 7b, each of the cathodes 7a and 7b can be formed in a semicircle, and the center magnet 6a and the peripheral magnet 6b can be arranged so as to maximize the effective region of the respective targets within the respective regions.

The cathodes 7a and 7b, the backing plate 10, and the coolant passage-forming plate 8 are integrally fixed to the bottom plate 19, and the shield 11 is positioned at the side of these integral parts. The shield 11 prevents adhesion of film-forming materials to the cathodes 7a and 7b, the backing plate 10, and the coolant passage-forming plate 8. To the cathodes 7a and 7b, the backing plate 10, and the coolant passage-forming plate 8, integrally fixed to the bottom plate 19, there are connected a rotary shaft 17 and a rotary joint 1 as the rotation mechanism of the cathode unit 30. A slip ring 2 is the power-supply mechanism which allows independent supply of power to each of the cathodes 7a and 7b at different power level from each other. The slip ring 2 is rotatably connected with the rotary shaft 17 via a magnetic seal 3. A motor 15 is connected with the rotary shaft 17 via gears 16 and 18. Accordingly, the motor 15 drives the rotary shaft 17, which then induces the rotation of the cathode unit 30.

A circular light-shield plate 13 is mounted on the rotary shaft 17, and rotates together with the rotary shaft 17. On rear side (sensor 14 side) of the light-shield plate 13, a semicircular black body part 26 is formed, (shown in FIG. 3 described later). The black body part 26 rotates synchronously with the rotation of the cathode unit 30. A sensor 14 detects the black body part 26. The sensor 14 may be arbitrary if only the sensor can distinguish the black body part 26 from other non-black part, shown in FIG. 3, and is preferably, for example, FU-6F optical fiber manufactured by Keyence Corporation.

Figure 13:
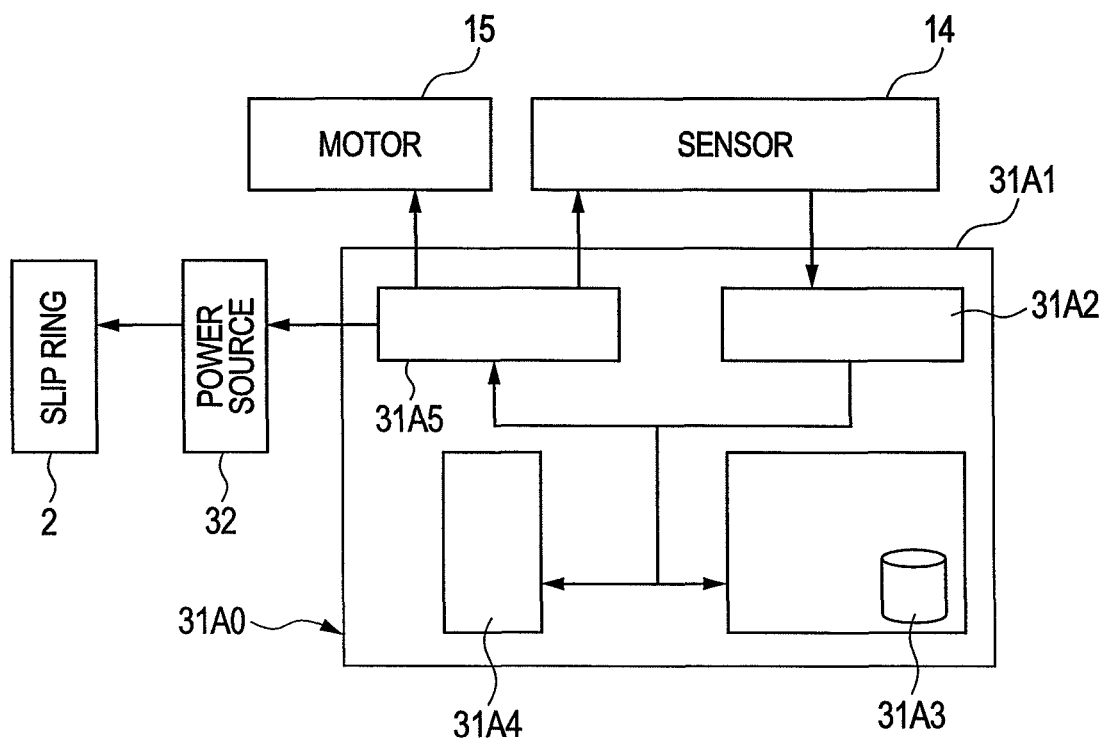
FIG. 13 is a block diagram illustrating outline of the control part for controlling the cathode unit in an embodiment of the present invention.

The sensor 14 detecting the black body part 26 is connected with a process controller 31A0 illustrated in FIG. 13. The process controller 31A0 is connected with the motor 15 and a power source 32.

That is, the process controller 31A0 receives an input signal from the sensor 14, and activates the program which is programmed so as to be executed by the flowchart for working a series of the steps in the discharge image (control image) given in FIG. 7 and FIG. 9 (described later), and then transmits an operation instruction to the motor 15 and to the power source 32 at an adequate timing, which allows supplying power to the sputtering apparatus.

The structure of the process controller 31A0 basically has a structure of a computer 31A1, for example. The computer 31A1 has an input part 31A2 for entering data coming from various devices such as the sensor 14, and a recording medium 31A3 having program and data. Furthermore, the computer 31A has a processor 31A4 which executes various treatment operations such as computation, control, and distinguishing, and an output part 31A5 which outputs operation instructions from the processor 31A4 to each device. With that structure, the process controller 31A0 controls the corresponding devices (such as the sensor 14, the motor 15, and the power source 32). The input part 31A2 can contain a keyboard or various switches for entering specific commands or data, and allows entering commands from outside (such as a user) other than the data-entering function from devices such as the sensor 14.

The program memorized in the recording medium 31A3 includes a program for executing the steps of discharge image illustrated in FIG. 7 and FIG. 9 (described later). The program of the present invention is configured so as to make the process controller 31A0 as the computer execute the following steps, for example.

Step a: The process controller 31A0 distinguishes the cathode 7a from the cathode 7b based on the information detected by the sensor 14.

Step b: The process controller 31A0 transmits an operation instruction to the power source 32 based on the information distinguished in the Step a, controls the power source 32 so as to supply power to the cathode 7a via the slip ring 2, and thus initiates the discharge of the cathode 7a.

Step c: The process controller 31A0 obtains at least one of the rotational angle and the number of rotations of each of the cathodes 7a and 7b detected by the sensor 14 during a period from the beginning to the end of the film-formation, and records the acquired information in the recording medium 31A3.

Step d: The process controller 31A0 determines the timing (such as clock and elapsed time) for initiating discharge of the cathode 7b based on the information detected by the sensor 14 and on at least one of the rotational angle and the number of rotations of the cathode 7b during a period from the beginning to the end of the film-formation on the cathode 7b, memorized in the recording medium 31A3.

Step e: The process controller 31A0 transmits an operation instruction to the power source 32 following the timing determined in the Step d, controls the power source 32 so as to supply power to the cathode 7b via the slip ring 2, and thus initiates the discharge of the cathode 7b.

Step f: The process controller 31A0 determines the timing (such as clock and elapsed time) for stopping discharge of the cathode 7a based on at least one of the rotational angle and the number of rotations of the cathode 7a during a period from the beginning to the end of the film-formation on the cathode 7a, memorized in the recording medium 31A3.

Step g: The process controller 31A0 determines the timing (such as clock and elapsed time) for stopping discharge of the cathode 7b based on at least one of the rotational angle and the number of rotations of the cathode 7b during a period from the beginning to the end of the film-formation on the cathode 7b, memorized in the recording medium 31A3.

Step h: The process controller 31A0 transmits an operation instruction to the power source 32 following the timing determined in the Step f, and controls the power source 32 so as to stop power supply to the cathode 7a, thus stopping the discharge of the cathode 7a. Furthermore, The process controller 31A0 transmits the operation instruction to the power source 32 following the timing determined in the Step g, controls the power source 32 to cause the discharge of the cathode 7b to be stopped, and thus stops the discharge of the cathode 7b.

It goes without saying that the above steps a to h are only for reference.

Figure 3:
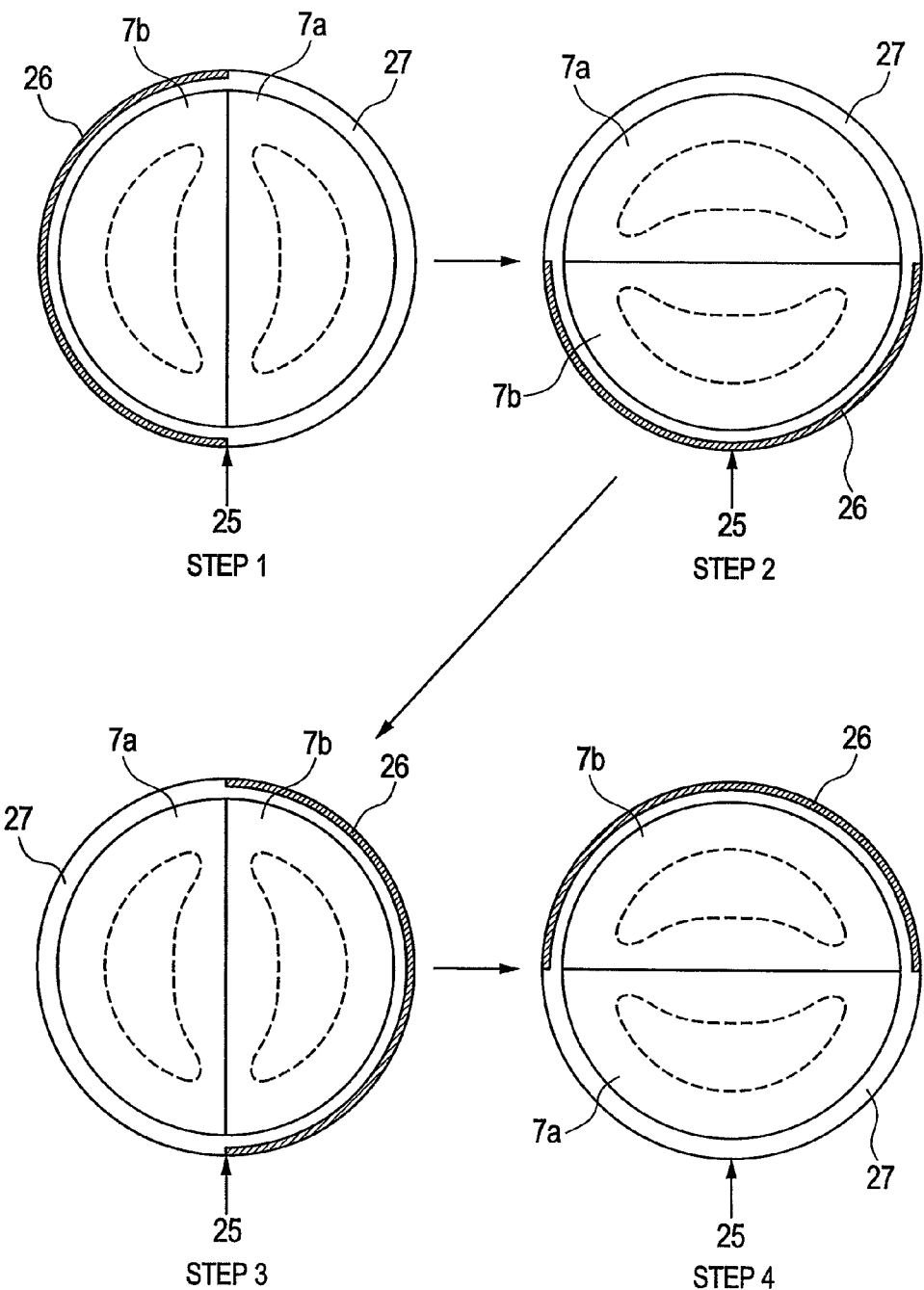
FIG. 3 is a schematic plan view illustrating the steps of forming multilayer film using the cathode unit of FIG. 1 and FIG. 2.

Following is the description about the method of forming multilayer film using the sputtering cathode illustrated in FIG. 1 and FIG. 2, referring to FIG. 3 and FIG. 4. FIG. 4 is a schematic cross-sectional view as an example of the multilayer film preferably formed in the present invention. The multilayer film is formed by mounting the target 1 and the target 2, made of different material from each other, on the cathode 7a and cathode 7b, respectively. The term "target 1" and "target 2" appeared in the figures signify the film formed by the target 1 and the target 2, respectively.

The first feature of the present invention is to successively form multilayer of films by sputtering through the use of a single cathode unit, as illustrated in FIG. 4, while rotating the cathode unit without interrupting the discharge at every film-forming step as in the conventional apparatus. By the procedure, a high productivity multilayer-film forming apparatus can be provided. The successive film formation becomes available in the present invention owing to the arrangement of two or more cathodes 7a and 7b encircling the rotation center of the cathode unit 30.

The second feature of the present invention is to install the sensor 14 detectable of the rotating positions of the respective two or more cathodes 7a and 7b, and to install the process controller 31A0 so as to be able to initiate discharge at each for forming the film (cathodes 7a and 7b) according to the rotating positions of two or more cathodes 7a and 7b.

Furthermore, according to the present invention, the magnet unit 6 positioned at rear side of each of the cathodes 7a and 7b does not rotate within the cathode unit 30 so that the effective region of the target mounted on each of the targets 7a and 7b becomes wide, thereby allowing forming the multilayer film in a short time.

FIG. 3 is a schematic plan view illustrating the steps of forming successively multilayer of films given in FIG. 4 through the use of the cathode unit 30 illustrated in FIG. 1 and FIG. 2. The film-formation proceeds in the sequence of Step 1, Step 2, Step 3, and Step 4, and then returns to Step 1. In FIG. 3, the reference numeral 25 indicates the detection position of the sensor 14. As described before, the black body part 26 is mounted on rear side of the light-shield plate 13 given in FIG. 1. FIG. 2 shows the black body part 26 overlaid on the cathode unit for convenience.

According to the present invention, the sensor 14 is located at rear side of the cathodes 7a and 7b, and the sensor 14 is fixed to the apparatus. At rear side of the rotating light-shield plate 13, a region of the semicircle part corresponding to the cathode 7b facing the sensor 14 is subjected to black body treatment to form the black body part 26, while the other semicircle part is left as solid metal (a metal part 27), as illustrated in FIG. 3. With the structure, the judgment of ON and OFF of the sensor 14 is done by the difference in the intensity of light reflected from the black body part 26 and the metal part 27. Also the sensor 14 is used for confirming normal rotation of the cathode unit.

As described above, the present invention detects the position of the cathode using the sensor 14 and the black body part 26. By forming the black body part 26 so as to correspond to the cathode 7b, the process controller 31A0 can recognize that the cathode facing the sensor 14 is the cathode 7b when the light intensity detected by the sensor 14 is relatively small, and that the cathode facing the sensor 14 is the cathode 7a when the light intensity detected by the sensor 14 is relatively large. Therefore, the black body part 26 positioned corresponding to the cathode 7b can be said as a marker for detecting the cathode 7b, and also the metal part 27 can be said as a marker for detecting the cathode 7a.

It is an important matter in the present invention that it can be distinguished whether the cathode facing the sensor 14 is cathode 7a or cathode 7b using the sensor 14. To do this, the sensor 14 is installed, and the black body part 26 as the first marker and the metal part 27 as the second marker are installed. The black body part 26 as the first marker is installed so as to rotate synchronously with the cathode unit 30 and to overlay the cathode 7b. The metal part 27 as the second marker is installed so as to rotate synchronously with the cathode unit 30 and to overlay the cathode 7a. Since the first marker and the second marker have different reflectances, the process controller 31A0 can distinguish the cathode facing the sensor 14 based on the intensity of light detected by the sensor 14.

Although the present invention adopts the black body part 26 and the metal part 27 as the first marker and the second marker, respectively, these are not limited ones. Since the present invention distinguishes the cathode by using the intensity of light detected by the sensor, any material can be used for the first marker and the second marker if only they have different reflectances.

Further, in FIGS. 1 to 3, the case of being provided with two cathodes has been described. For the cases of being provided with three or more cathodes, the respective markers have only to be provided under similar condition described above. In the case of being provided with four cathodes, as an example, four markers each having a different reflectance (the first reflectance>the second reflectance>the third reflectance>the fourth reflectance) have only to be provided. That is, the first marker which is positioned corresponding to the first cathode (positioned so as to overlay the first cathode) and has the first reflectance, the second marker which is positioned corresponding to the second cathode (positioned so as to overlay the second cathode) and has the second reflectance, the third marker which is positioned corresponding to the third cathode and has the third reflectance, and the fourth marker which is positioned corresponding to the fourth cathode and has the fourth reflectance are made rotatable synchronous with the cathode unit 30.

For example, the intensity of light reflected from each of the first to fourth markers is detected by the sensor 14, a table relating the light intensity with the respective markers is formed, and the table is then stored in the recording medium 31A3 in advance. Consequently, the process controller 31A0 can recognize the marker corresponding to the information of light intensity referring to the table based on the information of light intensity indicating the light intensity transmitted from the sensor 14, thereby allowing distinguishing the cathode facing the sensor 14.

When the irradiation environment peripheral to the sensor 14 and to each marker is unstable, the corresponding marker may be selected responding to the relative magnitude of the intensity of light detected by the sensor 14. That is, when the intensity of light detected by the sensor 14 is relatively the largest, the table having recognized that the marker facing the sensor 14 was the first marker is prepared. Similarly, there is recognized in the table as follows: when the intensity of light detected by the sensor 14 is relatively the second largest, the marker facing the sensor 14 is the second marker; when the intensity of light detected by the sensor 14 is relatively the third largest, the marker facing the sensor 14 is the third marker; and when the intensity of light detected by the sensor 14 is relatively the smallest, the marker facing the sensor 14 is the fourth marker. The table is stored in the recording medium 31A3 in advance. During one rotation of the cathode unit 30, the sensor 14 detects all the reflected light on the first to fourth markers. Therefore, the process controller 31A0 can grasp the sequential order of the information of intensity of light detected by the sensor 14, which thus allows selecting the marker corresponding to the magnitude of the light intensity in the sequential order by using the table. As a result, the process controller 31A0 can distinguish the corresponding cathode.

In actually forming a multilayer film, as illustrated in Step 1 of FIG. 3, the process controller 31A0 initiates the discharge at the ON or OFF timing of the sensor 14 by the cathode 7a. For the cathode 7b, the discharge is initiated after initiating the discharge of the cathode 7a and at the time of 180 degree rotation of the cathode unit, (Step 3 of FIG. 3). That timing can be set to the time determined from the rotational speed of the cathode unit 30. For example, when the cathode unit 30 rotates at a speed of 60 rpm, one rotation takes one second, and the rotation by 180 degree takes 0.5 seconds. That is, the process controller 31A0 calculates the time necessary for a single rotation based on the rotational speed of the cathode unit 30, and stores the time in the recording medium 31A3. Consequently, the process controller 31A0 can calculate the elapsed time from a certain reference clock corresponding to the number of rotations (rotation angle) of the cathode unit 30 from the reference clock based on the time necessary for one rotation.

The cathode 7a or the cathode 7b can mount targets having different materials (compositions). Therefore, when the cathode 7a and the cathode 7b successively discharge, each one layer of film of the target mounted on each of the cathode 7a and the cathode 7b can be formed at every rotation of the cathode unit 30, as illustrated in FIG. 4.

Figure 8:
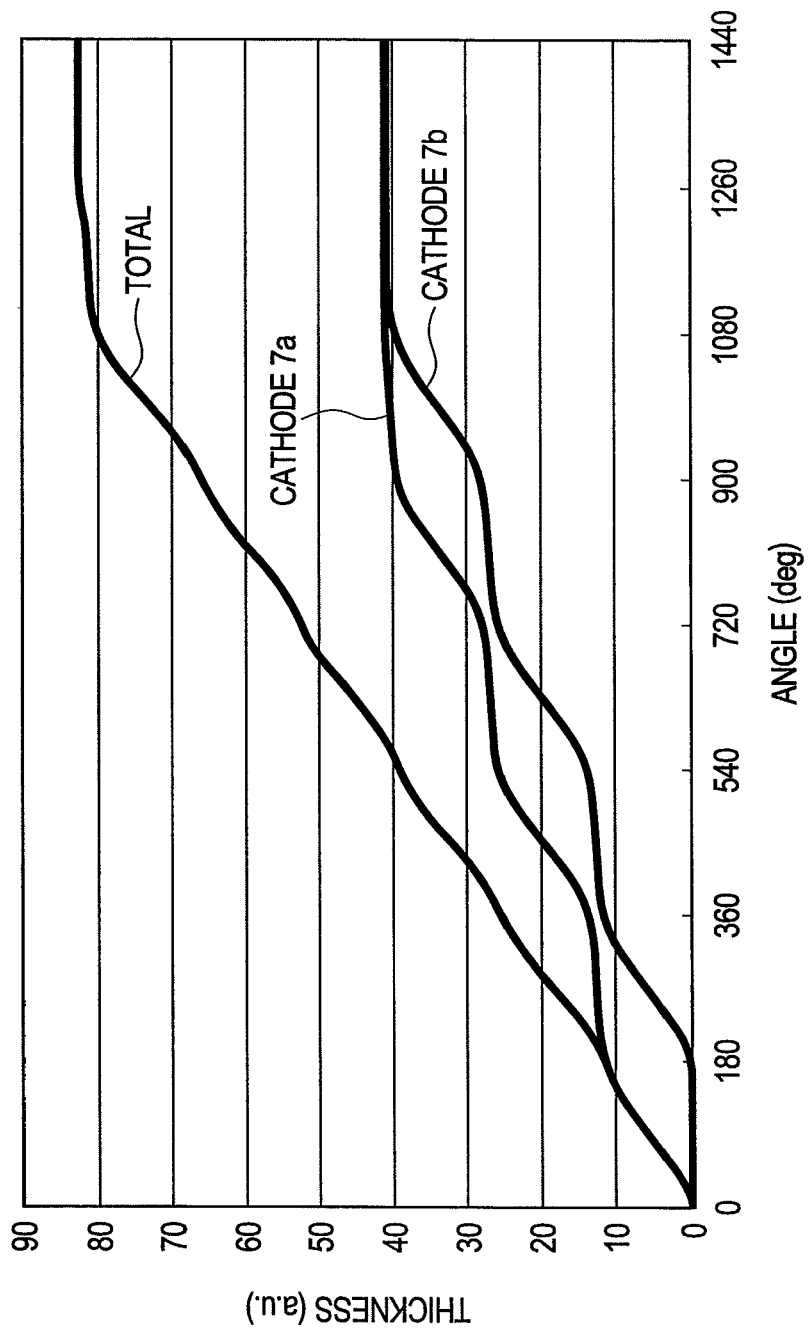
FIG. 8 shows the relation between the thickness of multilayer film obtained by the control given in FIG. 7 and the rotation angle (elapsed time) of the cathode unit.

After initiating the discharge of the cathode 7a, the cathode unit 30 initiates the discharge of the cathode 7b at the time of rotating the cathode unit 30 by 180 degree, (Step 3 of FIG. 3), and thus the thickness of the laminated film formed on the substrate is given in FIG. 8. As illustrated in FIG. 8, for example within the range of rotational angle from 0 to 360 degree of the cathode unit 30, the range affecting the thickness of the laminated film formed on the substrate corresponds to the range from 0 to 180 degree of the cathode 7a, and the range from 180 to 360 degree of the cathode 7b, and thus the spiral pattern described in the case of Patent Document 2 is not provided. When the detection of the position of initiating the discharge is not performed, the discharge may be initiated without referring to the timing of ON and OFF of the sensor 14.

First Embodiment

Figure 7:
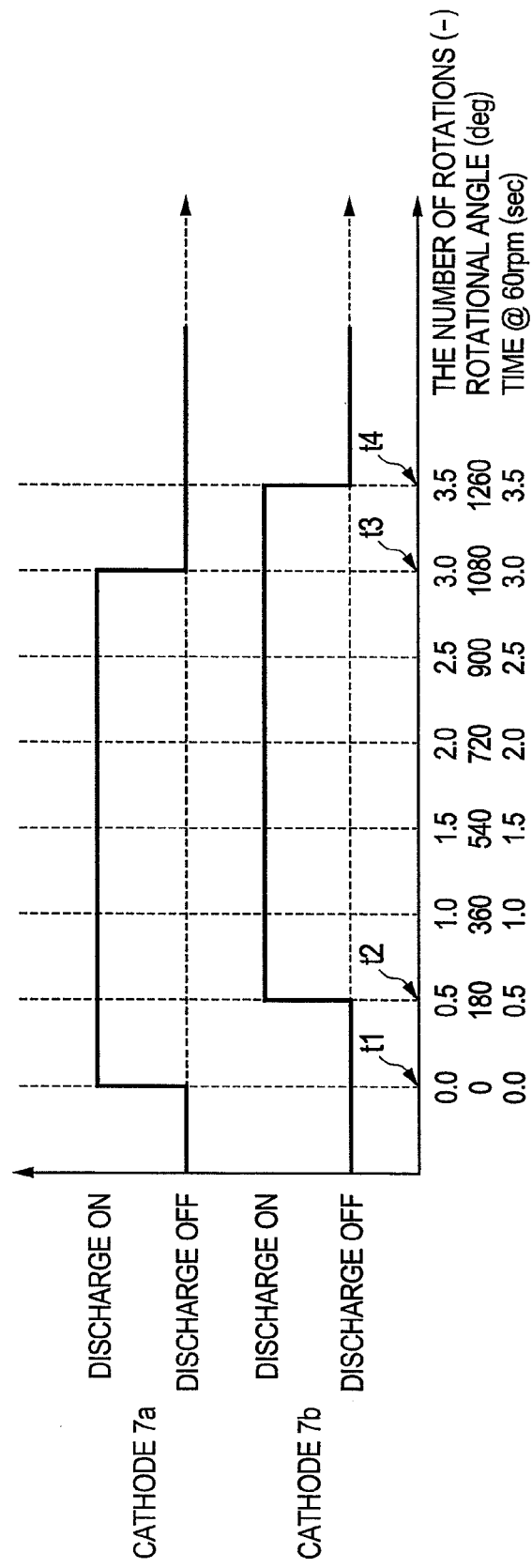
FIG. 7 is a timing chart illustrating the control image of film-forming treatment according to an embodiment of the present invention.

FIG. 7 is a timing chart illustrating the control image of film-forming treatment according to the first embodiment. FIG. 8 shows the increase in the thickness of laminated film with time in forming the multilayer film on the substrate by using the control image of FIG. 7. The figure of increase in the thickness of laminated film with time given in FIG. 8 is a development drawing at a part corresponding to a region 1201 in FIG. 12B.

The first feature of the first embodiment is to successively form multilayer of films while rotating the cathode unit 30, without interrupting the discharge at every film-forming step. The second feature thereof is to install the sensor 14 capable of detecting the rotating positions of the respective two or more cathode 7a and cathode 7b, and to install the process control mechanism so as to be able to initiate discharge at the time of forming each film (cathodes 7a and 7b) responding to the rotating positions of two or more cathodes 7a and 7b.

According to the first embodiment, there are formed laminated films, laminated in an order of the target 1 placed on the cathode 7a and the target 2 placed on the cathode 7b, with each three layers of the target 1 and the target 2.

According to the first embodiment, the metal part 27 corresponds to the cathode 7a, and the black body part 26 corresponds to the cathode 7b. Consequently, when the light intensity detected by the sensor 14 is relatively large, the cathode facing the sensor 14 is the cathode 7a, and when the light intensity detected by the sensor 14 is relatively small, the cathode facing the sensor 14 is the cathode 7b.

The user manipulates the input part 31A2 to enter the structural information indicating the structure of the multilayer film to be formed. According to the first embodiment, the structural information is the information indicating that the multilayer film to be formed is the one being formed on the substrate in an order of target 1 to target 2, each three layers of the target 1 and the target 2 being laminated. Consequently, the process controller 31A0 can recognize the kind and the sequential order of target to be deposited on the substrate through the analysis of the structural information.

When receiving the entered structural information, the process controller 31A0 transmits an operation instruction to the motor 15 to cause the cathode unit 30 to rotate. At that moment, both the black body part 26 and the metal part 27 also rotate synchronously with the rotation of the cathode unit 30. Thus the process controller 31A0 can grasp the position of the cathode 7a and the cathode 7b based on the information of light intensity transmitted from the sensor 14.

Once the process controller 31A0 analyzes the structural information and recognizes that the target to be deposited first on the substrate is the target 1, the process controller 31A0 determines that the cathode to be initiated the discharge first is the cathode 7a. Then, following the determination, the process controller 31A0 detects the rotating position of the cathode 7a using the sensor 14. When the detected light intensity varied from small to large, (the timing t1 in FIG. 7), the process controller 31A0 transmits an operation instruction to the power source 32 to cause the discharge of the cathode 7a to be initiated. The timing t1 is selected to the reference clock, and the number of rotations of the cathode unit 30 at the timing t1 is counted to zero rotation, and the rotational angle at that timing is counted to zero degree. That is, the timing t1 is selected to the reference of the number of rotations, the rotational angle, and the rotational time (elapsed time) of the cathode unit 30. As illustrated in FIG. 7, first, the entire cathode unit 30 is rotated while initiating the discharge of the cathode 7a. When the rotational angle of the cathode unit 30 is within the range of 0 to 180 degree, the cathode 7b does not discharge so that only the film of the target 1 (for example the target material (Co film)) placed on the cathode 7a is formed on the substrate.

When the cathode 7a comes to the position of 180 degree of the rotational angle of the cathode unit 30, the process controller 31A0 detects the rotating position of the cathode 7b by using the sensor 14, and thus the discharge of the cathode 7b is initiated. That is, the process controller 31A0 detects the rotating position of the cathode 7b by using the sensor 14, and when the detected light intensity varies from large to small, (the timing t2 in FIG. 7), the process controller 31A0 transmits an operation instruction to the power source 32 to cause the discharge of the cathode 7b to be initiated. At that moment, the discharge of the cathode 7a is sustained. The region 1201 in FIG. 12B, however, faces the cathode 7b, and the partition 20 allows very little deposition of the target material of the cathode 7a onto the substrate, while the target 2 (target material (Pt film)) placed on the cathode 7b is deposited. This state continues for a period of 180 to 360 degree of the rotational angle of the cathode unit 30.

As described above, according to the first embodiment, the target depositing on the substrate is switched at every half rotation of the cathode unit 30. That is, when the cathode unit 30 rotates by one rotation (the rotational angle of 360 degree, and the elapsed time of 1 second), each one layer of the target 1 and the target 2 is formed. Since the first embodiment forms each three layers of the target 1 and the target 2, the necessary discharge time (elapsed time) is 3 seconds (the number of rotations (also referred to as the "discharge number of rotations") from the initiation of the discharge to the end of the discharge for the cathode unit 30 is three, and the rotational angle (also referred to as the "discharge rotational angle") is 1080 degree). Therefore, once the process controller 31A0 analyzes the structural information and recognizes that each three layers of the target 1 and the target 2 are formed, the process controller 31A0 calculates at least one of the discharge time (3 seconds), the discharge number of rotations (3), and the discharge rotational angle (1080 degree) based on the rotational speed of 60 rpm of the cathode unit 30, and thus stores the calculation result in the recording medium 31A3. Although in the first embodiment, the number of rotations is described, the same can be applied to the rotational angle and the discharge time.

Next, the process controller 31A0 reads the discharge number of rotations (3) stored in the recording medium 31A3, adds 3 of the discharge number of rotations to the zero number of rotation at the timing t1 being the initiation time of discharge to the cathode 7a, and thus calculates the number of rotations of 3.0 of the cathode unit 30 at the timing t3 being the discharge-stopping time of the cathode 7a, and the number of rotations of 3.0 is then stored in the recording medium 31A3. Similarly, then the process controller 31A0 adds 3 of the discharge number of rotations to the number of 0.5 rotation at the timing t2 as the initiation time of discharge of the cathode 7b, and thus calculates the number of rotations of 3.5 of the cathode unit 30 at the timing t4 as the discharge-stopping time of the cathode 7b, and the number of rotations of 3.5 is stored in the recording medium 31A3.

When the cathode unit 30 rotates by 3 rotations from the timing t1, (the timing t3), the process controller 31A0 stops the discharge of the cathode 7a, and when the cathode unit 30 rotates by 3.5 rotations from the timing t1, (the timing t4), the process controller 31A0 stops the discharge of the cathode 7b.

Figure 12A:
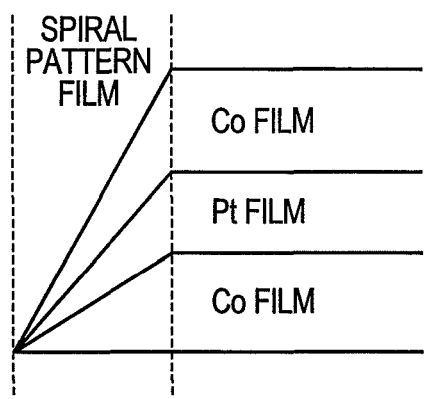
FIG. 12A illustrates a film formed in a spiral pattern using the multilayer-film forming apparatus of FIG. 10.
Figure 12B:
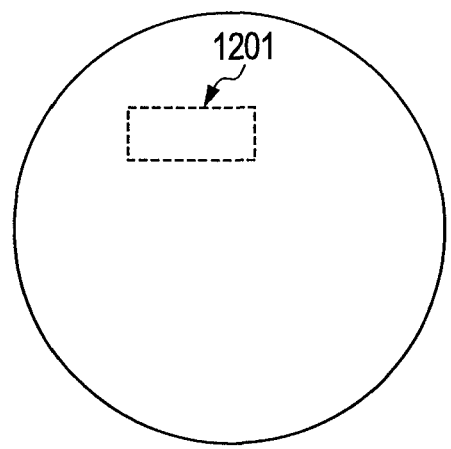
FIG. 12B illustrates a film formed in a spiral pattern using the multilayer-film forming apparatus of FIG. 10.

When the rotational angle of the cathode unit 30 is within the range of 360 to 540 degree, the region 1201 in FIG. 12B faces the cathode 7a, and the installed partition 20 allows very little deposition of the target material (target 2) of the cathode 7b onto the substrate, while the target 1 (target material (Co film)) of the cathode 7a is deposited.

At the point that the cathode unit 30 rotates by 3 rotations (1080 degree) from the timing t1, or at the above-calculated timing t3, the process controller 31A0 transmits an operation instruction to the power source 32 to cause the discharge of the cathode 7a to be stopped. Then, at the point that the cathode unit 30 rotates by 3.5 rotations (1260 degree) from the timing t1, (at the point of 3.0 rotations from the timing t2), or at the above-calculated timing t4, the process controller 31A0 transmits an operation instruction to the power source 32 to cause the discharge of the cathode 7b to be stopped.

According to the first embodiment, by the sensor 14, the black body part 26, and the metal part 27 it can be determined what the cathode facing the sensor 14 is. Consequently, the process controller 31A0 acquires the number of rotations (rotational angle or elapsed time) of the cathode unit 30. For example, when the intensity of light detected by the sensor 14 varies from large to small, the process controller 31A0 has only to increase the number of rotations of the cathode unit 30 by one. The process controller 31A0 measures the number of rotations of the cathode unit 30 based on the information obtained by the sensor 14, and thus the process controller 31A0 can grasp the current number of rotations of the cathode unit 30 even when the rotational speed of the cathode unit 30 is varied in the middle of a case or the like where the thickness of film to be formed is varied. As a result, even when the rotational speed of the cathode unit 30 varies as described above, the stop of discharge can be executed at an adequate timing.

As described above, the first embodiment adopts the sensor which can detect the rotating position of the cathode 7a and the cathode 7b, and control is performed so that the discharge is initiated and stopped at the position where the substrate faces the cathode 7a and the cathode 7b, respectively, and thus the multilayer film can be formed without forming spiral pattern film.

Furthermore, at the stop of discharge, in the same way as the initiation of the discharge, the discharge of the cathode 7a is stopped at the timing of ON or OFF of the sensor 14, and as to the cathode 7b, the discharge is stopped after the discharge of the cathode 7a is turned OFF and at the time when the cathode unit 30 is rotated 180 degree, (Step 1 of FIG. 3). The ON or OFF timing of the sensor 14 is to be integrated into either ON at the time of the initiation and OFF at the time of the stop, or OFF at the time of the initiation and ON at the time of the stop. With that control, a uniform film can be formed on the substrate by controlling the positions at the beginning and end of the discharge. For forming a uniform film, the position at the end of the discharge may be controlled by the time (the rotational angle).

Second Embodiment

Figure 9A:
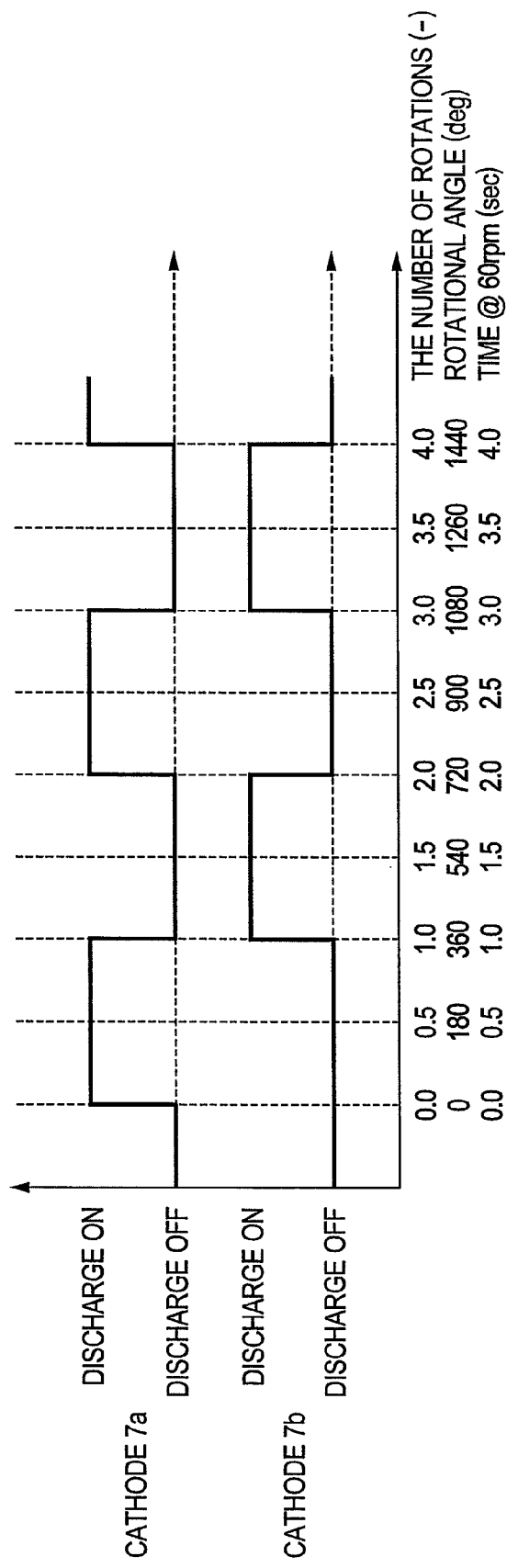
FIG. 9A is a timing chart illustrating the control image of film-forming treatment according to an embodiment of the present invention.
Figure 9B:
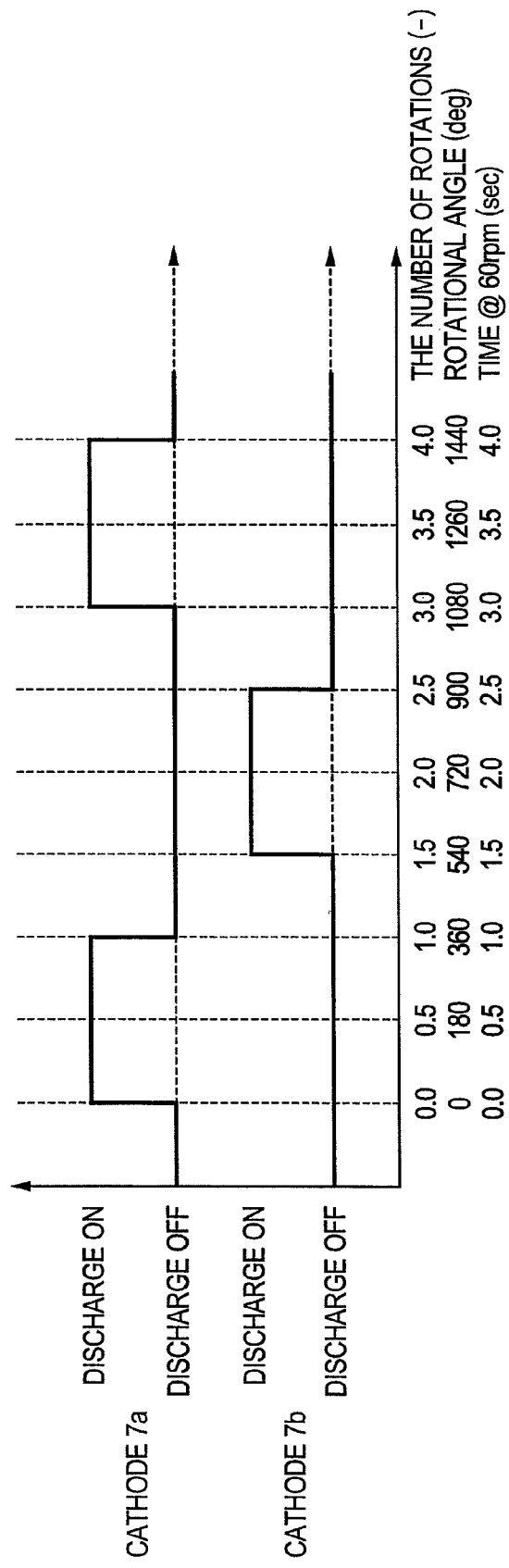
FIG. 9B is a timing chart illustrating the control image of film-forming treatment according to an embodiment of the present invention.
Figure 10:
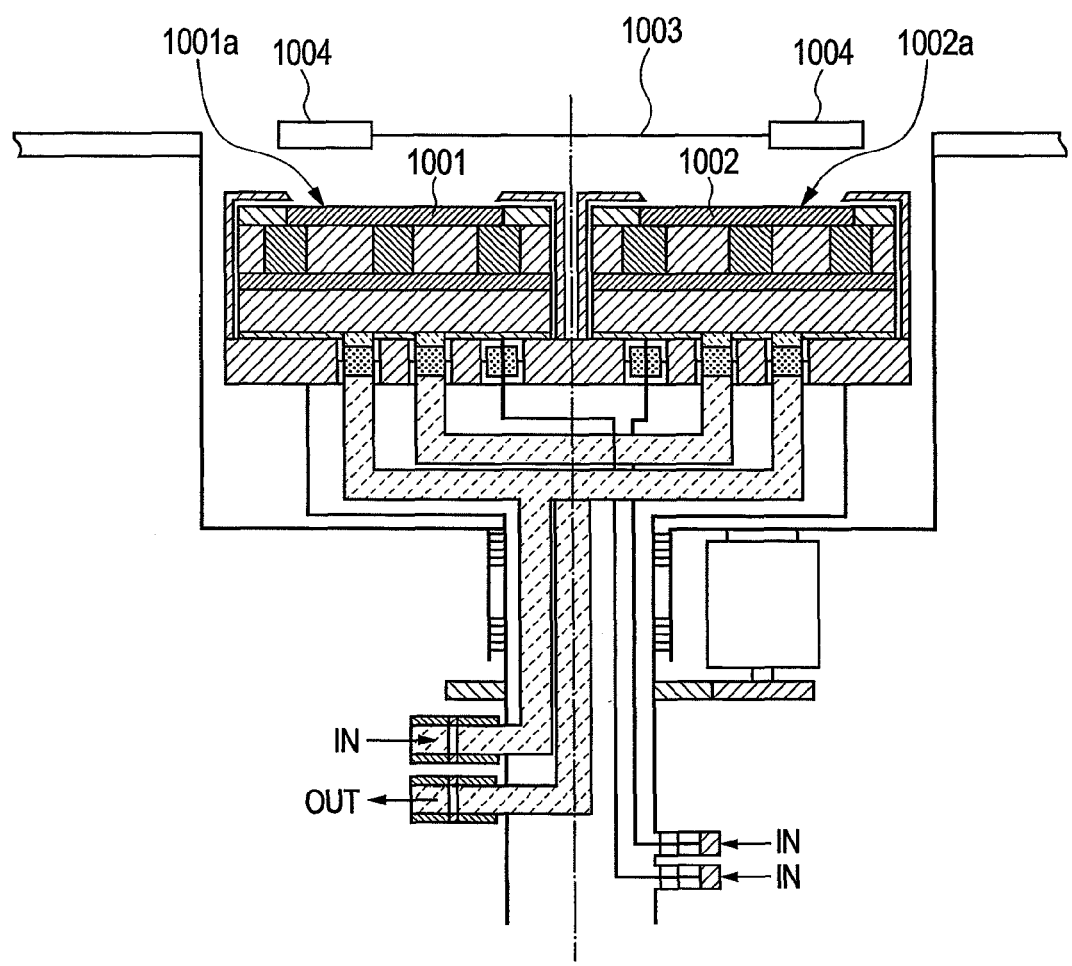
FIG. 10 is a structural example of conventional multilayer-film forming apparatus.
Figure 11A:
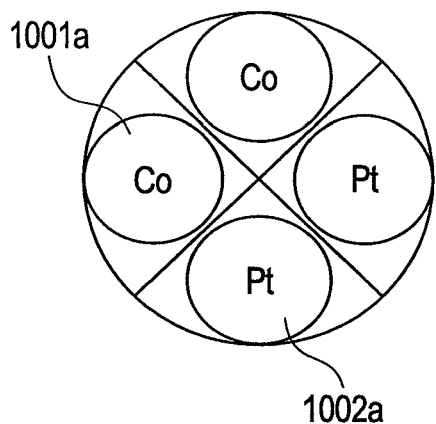
FIG. 11A illustrates an example of the arrangement and the shape of targets in the multilayer-film forming apparatus of FIG. 10.
Figure 11B:
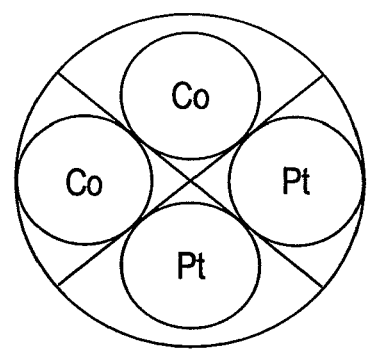
FIG. 11B illustrates an example of the arrangement and the shape of targets in the multilayer-film forming apparatus of FIG. 10.
Figure 11C:
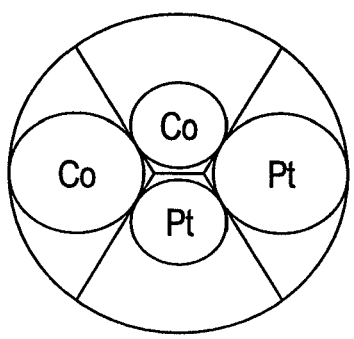
FIG. 11C illustrates an example of the arrangement and the shape of targets in the multilayer-film forming apparatus of FIG. 10.
Figure 11D:
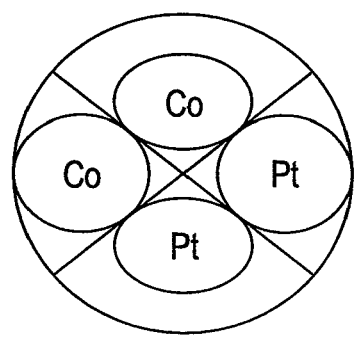
FIG. 11D illustrates an example of the arrangement and the shape of targets in the multilayer-film forming apparatus of FIG. 10.

The second embodiment executes the control of film thickness for every layer by controlling the applied power of separately-installed discharge power source. Consequently, the power source 32 has a power source for the cathode 7a and the power source for the cathode 7b. FIGS. 9A and 9B are the timing charts illustrating the control image of film-forming treatment according to the second embodiment.

The difference between the control image of FIG. 9A from that of FIG. 7 lies in the separate control of the initiation and stop of discharge of the cathode 7a, and the initiation and stop of discharge of the cathode 7b. Specifically in the discharge image of FIG. 9A, when the rotational angle of the cathode unit 30 is at the rotational position of 0 degree, the process controller 31A0 detects the position of the cathode 7a using the sensor 14, and activates the power source for the cathode 7a of the power source 32 to initiate the discharge of the cathode 7a. When the rotational angle of the cathode unit 30 is at the rotational position of 360 degree (one rotation), the process controller 31A0 detects the position of the cathode 7a using the sensor 14, and activates the power source for the cathode 7a of the power source 32 to cause the discharge of the cathode 7a to be stopped. At the time of stop of the discharge, the process controller 31A0 activates the power source for the cathode 7b of the power source 32 to cause the discharge of the cathode 7b to be initiated. When the rotational angle of the cathode unit 30 is at the rotational position of 720 degree (two rotations), the process controller 31A0 detects the position of the cathode 7b using the sensor 14, and activates the power source for the cathode 7b of the power source 32 to cause the discharge of the cathode 7b to be stopped.

In the above case of controlling the discharge in accordance with the control image given in FIG. 9A, the process controller 31A0 initiates the discharge of the cathode 7b at the same time as the stop of discharge of the cathode 7a. That is, the process controller 31A0 stops the discharge of a certain cathode after rotating the cathode unit 30 by a specified number of rotations (rotational angle, elapsed time), and simultaneously initiates the discharge of one cathode among other cathodes. Consequently, the control image given in FIG. 9A has no time of overlapping the discharge of the cathode 7a with the cathode 7b. As a result, in the case of, for example, forming a film (Co film) of the target material of the cathode 7a on the substrate, there is no mixing of the target material (Pt film) of the cathode 7b, which is a specific effect that cannot be given by the film-forming image of FIG. 7.

Therefore, for example, when the number of rotations of the cathode unit 30 necessary for the discharge of each cathode is set as one (or 360 degree of rotational angle or 1 sec of elapsed time), and when the received signal of structural information indicates that the target multilayer film is the one obtained by forming the target 1 and the target 2 in this order on the substrate, giving each three layers of the target 1 and the target 2, the process controller 31A0 controls the power source 32 to cause the discharge of the cathode 7a to be initiated on which the target 1 is placed, (the initiation is set as zero rotation). When the discharge to the cathode 7a is continued between zero rotation of the cathode unit 30 and one rotation thereof, the target 1 forms a single layer on the substrate.

Next, when the process controller 31A0 judges that the cathode unit 30 has completed one rotation based on the detection result of the sensor 14, the process controller 31A0 stops the discharge of the target 7a, and simultaneously controls the power source 32 to cause the discharge of the cathode 7b to be initiated, on which the target 2 is placed, (at this moment, the number of rotations of the cathode unit 30 is one). When the discharge of the cathode 7b is continued from the above-one rotation to further one rotation of the cathode unit 30, a single layer of the target 2 is formed on the target 1 on the substrate. The procedure is repeated by the number of layers required to be formed, the number being included in the structural information. When the cathode unit 30 rotated by six rotations following the detection result of the sensor 14, the process controller 31A0 stops the discharge of the cathode 7b to complete the film-formation treatment. As a result, there can be obtained a multilayer film having three layers of the target 1 and the target 2, laminated alternately on the substrate.

The control image given in FIG. 9B also separately controls the film-thickness for each layer in the same way as the control image in FIG. 9A. The difference in the control image from that in FIG. 9A is that, after initiating the discharge of the cathode 7a to form a film on the substrate, and after stopping the discharge of the cathode 7a, a specified interval is maintained before initiating the discharge of the cathode 7b. Specifically, in the control image (discharge image) of FIG. 9B, when the rotational angle of the cathode unit 30 is at the rotational position of 0 degree, the process controller 31A0 detects the position of the cathode 7a using the sensor 14, and activates the power source for the cathode 7a of the power source 32 to cause the discharge of the cathode 7a to be initiated. When the rotational angle of the cathode unit 30 is at the rotational position of 360 degree (one rotation), the process controller 31A0 detects the position of the cathode 7a using the sensor 14, and activates the power source for the cathode 7a of the power source 32 to cause the discharge of the cathode 7a to be stopped. Up to this step, the control image is the same as that in FIG. 9A.

The control image of FIG. 9B differs from that of FIG. 9A in that both the cathode 7a and the cathode 7b do not initiate discharge when the rotational angle of the cathode unit 30 is within the range of 360 degree (one rotation) to 540 degree (1.5 rotations). When the cathode unit 30 is at the rotational position of 540 degree of rotational angle (1.5 rotations), the process controller 31A0 detects the position of the cathode 7b using the sensor 14, and activates the power source for the cathode 7b of the power source 32 to cause the discharge of the cathode 7b to be initiated. When the rotational angle of the cathode unit 30 is at the rotational position of 900 degree (2.5 rotations), the process controller 31A0 detects the position of the cathode 7b using the sensor 14, and activates the power source for the cathode 7b of the power source 32 to cause the discharge of the cathode 7b to be stopped. When the cathode unit 30 is within the range of 900 degree of rotational angle (2.5 rotations) to 1080 degree of rotational angle (3 rotations), the process controller 31A0 does not initiate discharge of both the cathode 7a and the cathode 7b.

As described above, the control image of FIG. 9B sets up a specified interval of time (specified number of rotations or specified rotational angle of the cathode unit 30) which does not initiate the discharge of both the cathode 7a and the cathode 7b, thus executing the film-forming. Consequently, the control image is considered to be most effective for the case of forming a multilayer film not in a spiral pattern and containing more reduced impurities on the substrate.

Since, also in the second embodiment, the process controller 31A0 can recognize the number of layers and the kind of target for each layer based on the structural information, the control images of FIG. 9A and FIG. 9B can be established.

When laminating a film of the target 1 at the final step of forming the multilayer film, the step of further rotating the cathode unit 30 by a half rotation at the end of the above procedure has only to be adopted to initiate the discharge of the cathode 7a.

Furthermore, when increasing the thickness of a single layer of the multilayer film, a step of decreasing the rotational speed of the cathode unit 30 has only to be adopted to thereby perform the same control as that in above, or alternatively there is adopted a step of discharging only the cathode 7a for a period of several rotations of the cathode unit 30, followed by stopping the discharge of the cathode 7a, and then discharging only the cathode 7b for a period of several rotations of the cathode unit 30. The discharge of the cathode 7a and of the cathode 7b is repeated by the number of laminations. All the discharge is controlled by the sensor 14 as described above.

With the sputtering apparatus of the present invention, when the distance between the cathode unit 30 and the substrate is sufficiently maintained, (about 60 mm or more), simultaneous sputtering from the targets mounted on pluralities of cathodes 7a and 7b can be done by simultaneous discharge therefrom.

EXAMPLES

In the Examples, a Pd target was mounted on the cathode 7a, and a Co target was mounted on the cathode 7b, which thus formed a film of Pd/(CoPd)×9/Pd.

When the cathode unit was in a positional state shown in Step 1 of FIG. 3, the sensor 14 given in FIG. 1 was positioned at a contact point between the cathode 7b on which the black body part 26 was mounted and the cathode 7a on which no black body part 26 was mounted. The sensor 14 detected the state, and the process controller 31A0 that the discharge of the cathode 7a was initiated. When, from a gas-supply mechanism (not shown), Ar gas was introduced so as to be a pressure of 10 Pa and synchronously a 350 W DC power was applied to the Pd target of the cathode 7a, the discharge was initiated to thereby deposit 10 nm thick Pd film on the substrate.

Next, when the cathode unit was in a positional state shown in Step 2 of FIG. 3, the sensor 14 was positioned at a portion of mounting the black body part 26 of the cathode 7b, and thus the process controller 31A0 judgedjudgedjudged that the discharge was continued, and continued the discharge.

Then, when the cathode 7b rotated by 180 degree as given in Step 3 of FIG. 3, the sensor 14 was positioned at a contact point between the cathode 7b on which the black body part 26 was mounted and the cathode 7a on which no black body part 26 was mounted. The sensor 14 detected the state, and the process controller 31A0 judged that the discharge of the cathode 7b was initiated, and thus the discharge of also the Co target of the cathode 7b was initiated. When the cathode unit 30 rotated by 9.5 rotations (3420 degree of rotation), nine layers of Co and Pd laminated film was formed.

At that moment, the cathode 7b on which the black body part 26 was mounted and the cathode 7a on which no black body part 26 was mounted (cathode 7a on which the metal part 27 was mounted), passed over the detection position 25 of the sensor 14 by 9.5 times. The sensor 14 detected the state of 9.5 times of passing, and stored the state in a control circuit of a separate computer so that the process computer 31A0 judges that discharge of the cathode 7b is stopped. With thus stored information, the discharge of Co target of the cathode 7b was stopped.

Since the discharge of the Pd target of the cathode 7a continued even after stopping the discharge of the Co target of the cathode 7b, the cathode unit 30 was rotated by a half rotation (180 degree) so as to be able to form a single Pd layer. The sensor 14 detected the state, and the process controller 31A0 judged that the discharge of the cathode 7a was stopped. After that, the discharge of the Pd target of the cathode 7a was stopped.

Figure 5B:
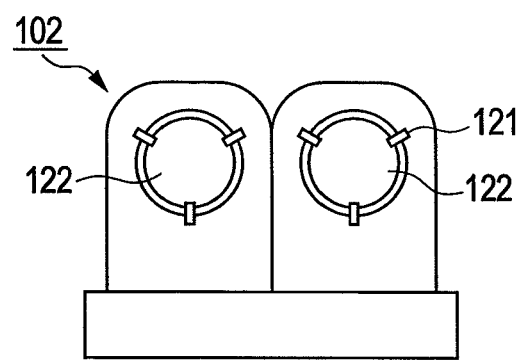
FIG. 5B is a front view of conventional carrier holding the substrates.
Figure 5C:
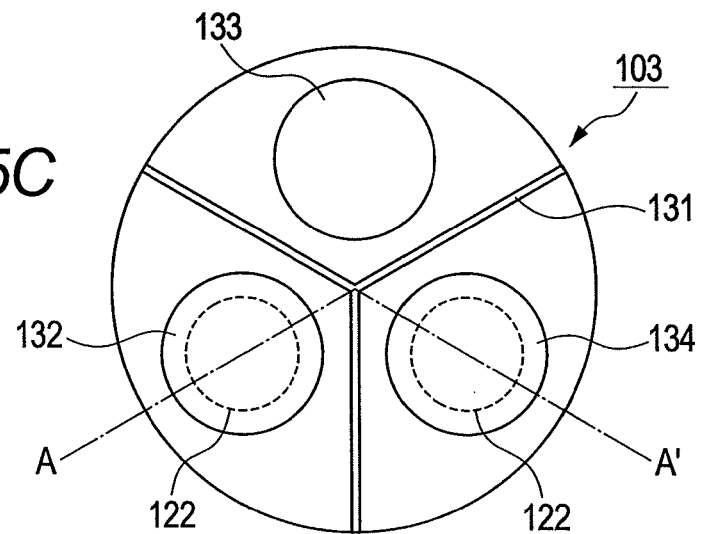
FIG. 5C is a plan view of the rotary cathode unit of the sputtering apparatus of FIG. 5A viewed from the substrate side.
Figure 6:
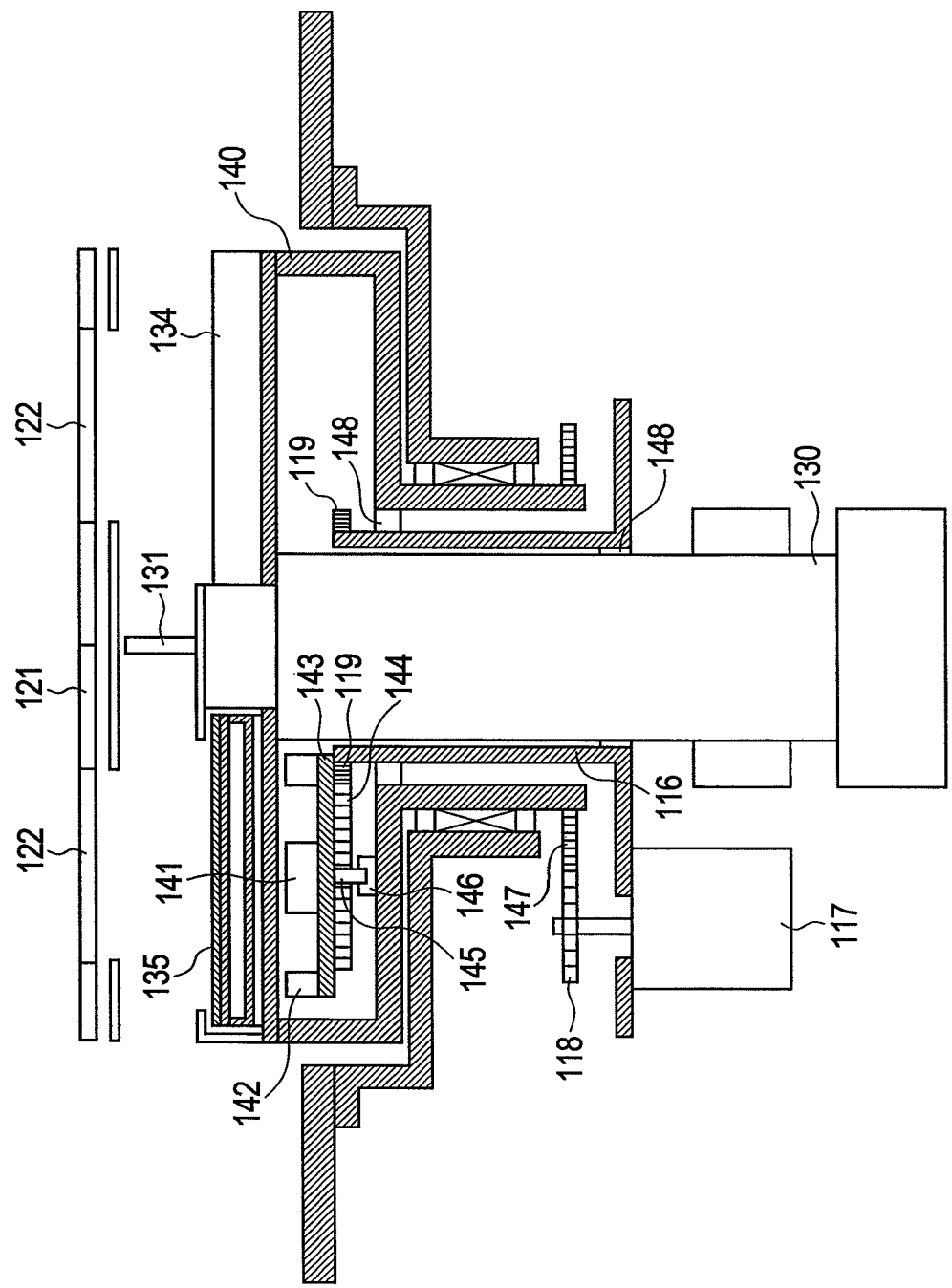
FIG. 6 is the A-A' section of FIG. 5C illustrating a schematic cross section to describe the structure of the rotary cathode unit of the sputtering apparatus.

In applying the apparatus given in FIG. 5 and FIG. 6 to form a Pd/(Co/Pd)×9/Pd film, the treatment time was 13 seconds because the treatment was given using a Pd target and a Co/Pd target. In contrast, in the case of using the sputtering apparatus, treatment time was 11 seconds.

Other Embodiment

The present invention can also be applied to a system comprising pluralities of devices (for example, a computer as the process controller, an interface device, a reader, a printer, and a multilayer-film sputtering apparatus), and also to an apparatus structured by a single device (a multilayer-film sputtering apparatus containing a process controller).

The scope of the above-described embodiments includes a treatment method in which a program which causes the above-described embodiment structure to operate so as to actualize the function of the process controller 31A0 in the above-described embodiments is stored in a recording medium, and the program stored in the recording medium is retrieved as a code to thereby execute the program in a computer. That is, a recording medium readable by a computer is included in the scope of the examples. In addition, a recording medium in which the above-described computer program is stored, and also the computer itself are included in the above-described embodiments.

Such types of recording media include floppy (trademark) disk, hard disk, optical disk, magneto-optic disk, CD-ROM, magnetic tape, nonvolatile memory card, and ROM.

Furthermore, not only the one that executes processing by a single program stored in the above-described recording medium, but also the one that operates on an OS and performs operation of the above-described embodiments in collaboration with the functions of other software and expansion board is also included in the scope of the above-described embodiments.

The invention claimed is:

1. A multilayer-film sputtering apparatus comprising:
a rotatable cathode unit having n cathodes (n being integer of 2 or larger) arranged on the same circumference with respect to the rotation center, and having a power-supply mechanism for supplying power to each cathode;
a sensor for detecting a position of the cathode;
a rotation mechanism for rotating the cathode unit; and
a control part for controlling the rotation mechanism and the power-supply mechanism,
wherein the control part controls the rotation mechanism so that the cathode unit continues the rotation thereof at the time of forming a multilayer film, and controls the power-supply mechanism based on a detection result of the sensor so as to supply power to a cathode corresponding to each layer in the multilayer film.

2. The multilayer-film sputtering apparatus according to claim 1, further comprising n members arranged so as each thereof to correspond to each of the n cathodes, and rotating synchronously with the rotation of the cathode unit, wherein the n members have different reflectance from each other,
the sensor is the one detecting reflectance different from each other of the n members, and the control part has:
a means for distinguishing at least one of a rotational angle and the number of rotations of each of the n cathodes based on the reflectance detected by the sensor; and
a means for controlling the power-supply mechanism so as to initiate power supply to the corresponding cathode and to stop power supply thereto, based on at least one of the rotational angle distinguished and the number of rotations distinguished.

3. The multilayer-film sputtering apparatus according to claim 1, wherein the control part controls discharge initiation and discharge stop of each cathode based on the detection result of the sensor.

4. A multilayer-film sputtering apparatus according to claim 2,
wherein the rotation mechanism has a rotary shaft and a motor for rotating the rotary shaft,
wherein the multilayer-film sputtering apparatus further comprises a light-shield plate rotating together with the rotary shaft, and
wherein the n members are formed on the light-shield plate.

5. A multilayer-film sputtering apparatus comprising:
a rotatable cathode unit having n cathodes (n being integer of 2 or larger) arranged on the same circumference with respect to the rotation center, and having a power-supply mechanism for supplying power to each cathode;
a rotation mechanism for rotating the cathode unit;
a detection means for detecting at least one of information of a rotational angle and information of the number of rotations of each of the n cathodes;
and a control means for controlling the rotation mechanism so that the cathode unit continues the rotation thereof at the time of forming a multilayer film, and for controlling the power-supply mechanism based on at least one of the detected information of the rotational angle and the detected information of the number of rotations so as to initiate discharge of a first cathode among the n cathodes, and after the stop of discharge or at the same time as the stop of discharge, initiate discharge of a second cathode among the n cathodes or stop discharge thereof.

6. A multilayer-film forming apparatus comprising:
a rotatable cathode unit having n cathodes (n being integer of 2 or larger) arranged on the same circumference with respect to the rotation center, and having a power-supply mechanism for supplying power to each cathode;
a rotation mechanism for rotating the cathode unit;
a light-shield plate rotating together with a rotary shaft of the rotation mechanism, positioned outside a treatment vessel containing the cathode unit, the light-shield plate being provided with n members each corresponding to each of the n cathodes, and each of n members having different reflectance from each other;
a sensor for detecting intensity of light reflected from each of the n members; and
a means for detecting position of each cathode based on the light intensity detected by the sensor.

7. The multilayer-film sputtering apparatus according to claim 6, further comprising a control part for controlling the rotation mechanism and the power-supply mechanism,
wherein the control part controls the rotation mechanism so as the cathode unit to continue the rotation thereof during a period of forming a multilayer film, and controls the power-supply mechanism based on a detection result obtained in the means for detecting so as to supply power to a cathode corresponding to each layer in the multilayer film.

* * * * *